(12) United States Patent
Milliron et al.

(10) Patent No.: US 7,341,917 B2
(45) Date of Patent: Mar. 11, 2008

(54) SOLUTION DEPOSITION OF CHALCOGENIDE FILMS CONTAINING TRANSITION METALS

(75) Inventors: Delia J. Milliron, Berkeley, CA (US); David B. Mitzi, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 11/055,976

(22) Filed: Feb. 14, 2005

(65) Prior Publication Data

US 2005/0158909 A1    Jul. 21, 2005

Related U.S. Application Data

(63) Continuation-in-part of application No. 10/801,766, filed on Mar. 16, 2004, now Pat. No. 7,094,651, and a continuation-in-part of application No. 10/617,118, filed on Jul. 10, 2003, now Pat. No. 6,875,661.

(51) Int. Cl.
*H01L 21/336* (2006.01)
(52) U.S. Cl. .............. 438/285; 438/95; 438/197; 438/590; 438/602
(58) Field of Classification Search .............. 438/285, 438/95, 197, 590, 602
See application file for complete search history.

(56) References Cited

U.S. PATENT DOCUMENTS

| | | | |
|---|---|---|---|
| 5,347,144 A | 9/1994 | Garnier et al. | |
| 6,180,956 B1 | 1/2001 | Chondroudis et al. | |
| 6,420,056 B1 | 7/2002 | Chondroudis et al. | |
| 2004/0062708 A1 | 4/2004 | Remskar et al. | |
| 2005/0009225 A1 | 1/2005 | Mitzi et al. | |
| 2005/0009229 A1 | 1/2005 | Mitzi | |

FOREIGN PATENT DOCUMENTS

| | | |
|---|---|---|
| JP | 2000277537 | 4/2000 |
| WO | WO-03049515 | 6/2003 |

OTHER PUBLICATIONS

"Photovoltaic Effect in Cadmium Sulfide", Reynolds, et al., *Aeronautical Research Laboratory, Wright Air Development Center, Air Research and Development Command*, United States Air force, Wright-Patterson Air Force Base, Ohio (Received Sep. 2, 1954), pp. 533-534.

(Continued)

*Primary Examiner*—Long Pham
(74) *Attorney, Agent, or Firm*—Connolly Bove Lodge & Hutz LLP; Ido Tuchman

(57) ABSTRACT

Metal chalcogenide films comprising at least one transition metal chalcogenide are prepared by dissolving a metal chalcogenide containing at least one transition metal chalcogenide in a hydrazine compound and, optionally, an excess of chalcogen to provide a precursor of the metal chalcogenide; applying a solution of said precursor onto a substrate to produce a film of said precursor; and annealing the film of the precursor to produce the metal chalcogenide film comprising at least one transition metal chalcogenide. The process can be used to prepare field-effect transistors and photovoltaic devices.

27 Claims, 2 Drawing Sheets

OTHER PUBLICATIONS

"Organic light-emitting diode with 20 lm/W efficiency using a triphenyldiamine slde-group polymer as the hole transport layer", Shaheen et al., *Applied Physics Letters* vol. 74, No. 21, May 24, 1999, pp. 3212-3214.

"Hybrid Field-Effect Transistor Based on a Low-Temperature Melt-Processed Channel Layer", Mitzi et al., *Advanced Materials* Dec. 3, 2002, 14, No. 23, pp. 1772-1776.

"Organic thin-film transistors: A review of recent advances" Dimitrakopoulos et al., *IBM J. Res. & Dev.* vol. 45, No. 1, Jan. 2001, pp. 11-27.

"Organic-inorganic electronics", Mitzi et al., *IBM J. Res. & Dev.* vol. 45, No. 1, Jan. 2001, pp. 29-45.

Fundamental Optical Absorption In $SnS_2$ and $SnSe_2$, Domingo et al., *Department of Electrical Engineering*, Northwestern University, Evanston, Illinois, Physical Review, vol. 143, No. 2, Mar. 1966.

"Solid State Electronic Devices," (second edition), Streetman, *Department of Electrical Engineering and Coordinated Science Laboratory University of Illinois at Urbana-Champaign*, p. 443.

"All-inorganic Field Effect Transistors Fabricated by Printing" Ridley et al., Science Magazine, vol. 286, pp. 746-749, Oct. 22, 1999.

"Composition of $CuInS_2$ thin films prepared by spray pyrolysis", Krunks et al., Thin Solid Films 403-404 (2002) pp. 71-75.

"Physics of Semiconductor Devices," (second edition), Sze, *Bell Laboratories, Incorporated*, Murray Hill, New Jersey, p. 849.

SOLUTION DEPOSITION OF CHALCOGENIDE FILMS CONTAINING TRANSITION METALS

CROSS REFERENCE TO RELATED APPLICATIONS

This application is a continuation-in-part of U.S. Ser. No. 10/617,118, filed Jul. 10, 2003 to Mitzi, entitled "Solution Deposition of Chalcogenide Films; and of U.S. Ser. No. 10/801,766 to Mitzi et al., filed Mar. 16, 2004 entitled "Hydrazine-Free Solution Deposition of Chalcogenide Films," the entire disclosures of which are incorporated herein by reference.

BACKGROUND

1. Technical Field

The present disclosure relates to methods of depositing a film of a metal chalcogenide comprising at least one transition metal chalcogenide. The present disclosure also relates to field-effect transistors and photovoltaic devices containing the metal chalcogenide films, as well as to methods of preparing the field-effect transistors and photovoltaic devices.

2. Background Art

The ability to deposit high quality semiconducting, metallic and insulating thin films forms an important pillar of present-day solid-state electronics. A solar cell may include, for example, a thin n-type semiconductor layer (~0.25 μm) deposited on a p-type substrate, with electrical contacts attached to each layer to collect the photocurrent. Light-emitting diodes (LED's) typically contain a p-n bilayer, which under proper forward bias conditions emits light.

Thin-film field-effect transistors, referred to herein as TFT's, include thin p- or n-type semiconducting channel layers, in which the conductivity is modulated by application of a bias voltage to a conducting gate layer that is separated from the channel by a thin insulating barrier. The electronic materials that comprise modem semiconducting devices have typically been silicon based, but can equally be considered from other families of materials, in some cases potentially offering advantages over the silicon-based technologies. Thin-film field-effect transistors (TFT's), are widely used as switching elements in electronic applications, most notably for logic and driver circuitry within processor and display applications. Presently, TFT's for many lower-end applications, including those employed in active matrix liquid crystal displays, are made using amorphous silicon as the semiconductor. Amorphous silicon provides a cheaper alternative to crystalline silicon—a necessary condition for reducing the cost of transistors for large area applications. Application of amorphous silicon is limited, however, to slower speed devices, since the mobility ($\sim 10^{-1}$ cm$^2$/V-sec) is approximately 15,000 times smaller than that of crystalline silicon.

In addition, although amorphous silicon is cheaper to deposit than crystalline silicon, deposition of amorphous silicon still requires costly processes such as plasma enhanced chemical vapor deposition. The search for alternative semiconductors (i.e., not silicon), for use in TFT's and other electronic devices is therefore being vigorously pursued.

If a semiconducting material could be identified which simultaneously provides higher mobility and low-cost processing at moderate/low temperatures, many new applications can be envisioned for these materials, including light, flexible, very large-area displays or electronics constructed entirely on plastic.

Recently, organic semiconductors have received considerable attention as potential replacements for inorganic counterparts in TFTs (see, for example, U.S. Pat. No. 5,347,144 assigned to Garnier et.al., entitled "Thin-Layer Field Effect Transistor With MIS Structure Whose Insulator and Semiconductor Are Made of Organic Materials") and LED's [S. E. Shaheen et al., "Organic Light-Emitting Diode with 20 Lm/W Efficiency Using a Triphenyldiamine Side-Group Polymer as the Hole Transport Layer," Appl. Phys. Lett. 74, 3212 (1999)].

Organic materials have the advantage of simple and low-temperature thin-film processing through inexpensive techniques such as spin coating, ink jet printing, thermal evaporation, or stamping. Over the last few years, the carrier mobilities of the organic channel layers in OTFTs (organic TFTs) have increased dramatically from $<10^{-4}$ to $\sim 1$ cm$^2$/V-sec (comparable to amorphous silicon) [see, for example, C. D. Dimitrakopoulos and D. J. Mascaro, "Organic thin-film transistors: A review of recent advances," IBM J. Res. & Dev. 45, 11-27 (2001)].

While very promising with regard to processing, cost, and weight considerations, organic compounds generally have a number of disadvantages, including poor thermal and mechanical stability. In addition, while the electrical transport in organic materials has improved substantially over the last 15 years or so, the mobility is fundamentally limited by the weak van der Waals interactions between organic molecules (as opposed to the stronger covalent and ionic forces found in extended inorganic systems).

The inherent upper bound on electrical mobility translates to a cap on switching speeds and therefore on the types of applications that might employ the low-cost organic devices. Organic semiconductors are therefore primarily being considered for lower-end applications.

One approach to improving mobility/durability involves combining the processibility of organic materials with the desirable electrical transport and thermal/mechanical properties of inorganic semiconductors within hybrid systems [D. B. Mitzi et al., "Organic-Inorganic Electronics," IBM J. Res. & Dev. 45, 29-45 (2001)]. Organic-Inorganic hybrid films have recently been suggested as the semiconductor element in electronic devices, including TFTs (see, for example, U.S. Pat. No. 6,180,956, to Chondroudis et al., entitled "Thin-Film Transistors with Organic-Inorganic Hybrid Materials as Semiconducting Channels") and LEDs (see, for example. U.S. Pat. No. 6,420,056, to Chondroudis et al., entitled "Electroluminescent Device with Dye-Containing Organic-Inorganic Hybrid Materials as an Emitting Layer").

Several simple techniques have been described for depositing crystalline organic-inorganic hybrid films, including multiple-source thermal evaporation, single source thermal ablation, and melt processing.

Solution-deposition techniques (e.g., spin coating, stamping, printing) have also received recent attention and are particularly attractive since they enable the quick and inexpensive deposition of the hybrids on a diverse array of substrates. TFT's based on a spin-coated semiconducting tin(II)-iodide-based hybrid have yielded mobilities as high as 1 cm$^2$/V-sec (similar to the best organic-based devices prepared using vapor-phase deposition and amorphous silicon). Melt-processing of the hybrid systems has improved the grain structure of the semiconducting films, thereby leading to higher mobilities of 2-3 cm$^2$/V-sec [D. B. Mitzi et.

al., "Hybrid Field-Effect Transistors Based on a Low-Temperature Melt-Processed Channel Layer," Adv. Mater. 14, 1772-1776 (2002)].

While very promising, current examples of hybrid semiconductors are based on extended metal halide frameworks (e.g., metal chlorides, metal bromides, metal iodides, most commonly tin(II) iodide). Metal halides are relatively ionic in nature, thereby limiting the selection of possible semiconducting systems with potential for high mobility. In addition, the tin(II)-iodide based systems in particular are highly air sensitive and all processing must be done under inert-atmosphere conditions. Furthermore, while the tin(II)-iodide-based systems are p-type semiconductors, it is also desirable to find examples of n-type systems to enable applications facilitated by complementary logic. So far none have been identified.

Another alternative to silicon-based, organic, and metal-halide-based hybrid semiconductors involves the use of metal chalcogenides (e.g., metal sulfides, metal selenides, metal tellurides) as semiconductive elements for use within TFT's and other electronic devices. Some of the earliest solar cells [D. C. Reynolds et al. "Photovoltaic Effect in Cadmium Sulfide," Phys. Rev. 96, 533 (1954)] and TFTs [P. K. Weimer, "The TFT—A New Thin-Film Transistor," Proc. IRE 50, 1462-1469 (1964)] were in fact based on metal chalcogenide active layers. There are numerous examples of metal chalcogenide systems that are potentially useful as semiconductive materials. Tin(IV) sulfide, $SnS_2$, is one candidate that has generated substantial interest as a semiconducting material for solar cells, with n-type conductivity, an optical band gap of ~2.1 eV and a reported mobility of 18 $cm^2/V$-sec [G. Domingo et al., "Fundamental Optical Absorption in $SnS_2$ and $SnSe_2$," Phys. Rev. 143, 536-541 (1966)].

These systems might be expected to yield higher mobility than the organic and metal-halide-based hybrids, as a result of the more covalent nature of the chalcogenides, and also provide additional opportunities for identifying n-type semiconductors.

Reported mobilities of metal chalcogenides, for example, include $SnSe_2$ (27 $cm^2/V$-sec/n-type) [G. Domingo et al., "Fundamental Optical Absorption in $SnS_2$ and $SnSe_2$", Phys. Rev. 143, 536-541 (1966)], $SnS_2$ (18 $cm^2/V$-sec/n-type) [T. Shibata et al., "Electrical Characterization of 2H-$SnS_2$ Single Crystals Synthesized by the Low Temperature Chemical Vapor Transport Method," J. Phys. Chem. Solids 52, 551-553 (1991)], CdS (340 $cm^2/V$-sec/n-type), CdSe (800 $cm^2/V$-sec/n-type) [S. M. Sze, "Physics of Semiconductor Devices," John Wiley & Sons, New York, 1981, p. 849], ZnSe (600 $cm^2/V$-sec/n-type) and ZnTe (100 $cm^2$ V-sec/p-type) [G. B Streetman, "Solid State Electronic Devices," Prentice-Hall, Inc., New Jersey, 1980, p. 443].

While the potential for higher mobility exists, the increased covalency of the extended metal chalcogenide systems also reduces their solubility and increases the melting temperature, rendering simple and low-cost thin film deposition techniques for these systems a significant challenge.

A number of techniques have been proposed and employed for the deposition of chalcogenide-based films, including thermal evaporation [A. Van Calster et al., "Polycrystalline cadmium selenide films for thin film transistors," J. Crystal Growth 86, 924-928 (1988)], chemical vapor deposition (CVD) [L. S. Price et al., "Atmospheric Pressure CVD of SnS and $SnS_2$ on Glass," Adv. Mater. 10, 222-225 (1998)], galvanic deposition [B. E. McCandless et al., "Galvanic Deposition of Cadmium Sulfide Thin Films," Solar Energy Materials and Solar Cells 36, 369-379(1995)], chemical bath deposition [F. Y. Gan et al., "Preparation of Thin-Film Transistors with Chemical Bath Deposite CdSe and CdS Thin Films," IEEE Transaction on Electron Devices 49, 15-18 (2002)], and successive ionic layer adsorption and reaction (SILAR) [B. R. Sankapal et al., "Successive ionic layer adsorption and reaction (SILAR) method for the deposition of large area (~10 $cm^2$) tin disulfide ($SnS_2$) thin films," Mater. Res. Bull. 35, 2027-2035 (2001)].

However, these techniques are generally not amenable to low-cost, high-thoughput (fast) solution-based deposition techniques such as spin-coating, printing and stamping.

Spray pyrolysis is one technique employing the rapid decomposition of a soluble precursor [M. Krunks et al., "Composition of $CuInS_2$ thin films prepared by spray pyrolysis," Thin Solid Films 403-404, 71-75 (2002)]. The technique involves spraying a solution, which contains the chloride salts of the metal along with a source of the chalcogen (e.g., $SC(NH_2)_2$), onto a heated substrate (generally in the range 250-450° C.).

While metal chalcogenide films are formed using this technique, the films generally have substantial impurities of halogen, carbon or nitrogen. Annealing in reducing atmospheres of $H_2$ or $H_2S$ at temperatures of up to 450° C. can be used to reduce the level of impurities in the film, but these relatively aggressive treatments are not compatible with a wide range of substrate materials and/or require specialized equipment.

Ridley et al. [B. A. Ridley et al., "All-Inorganic Field Effect Transistors Fabricated by Printing," Science 286, 746-749 (1999)] describes CdSe semiconducting films that are printed using a soluble metal chalcogenide precursor formed using organic derivatized CdSe nanocrystals. This technique, however, requires the formation of nanocrystals with tight control on particle size distribution in order to enable effective sintering during a postdeposition thermal treatment. The particle size control requires repeated dissolution and centrifugation steps in order to isolate a suitably uniform collection of nanocrystals.

Further, reported TFT devices prepared using this technique exhibited unusual features, including substantial device hysteresis and negative resistance in the saturation regime, perhaps as a result of trap or interface states either within the semiconducting film or at the interface between the semiconductor and the insulator.

Dhingra et al. [S. Dhingra et al., "The Use of Soluble Metal-Polyselenide Complexes as Precursors to Binary and Ternary Solid Metal Selenides", Mat. Res. Soc. Symp. Proc. 180,825-830(1990)] have also demonstrated a soluble precursor for metal chalcogenides that can be used to spin coat films of the corresponding metal chalcogenide (after thermal treatment to decompose the precursor).

However, in this process, the species used to solubilize the chalcogenide framework (i.e., quaternary ammonium or phosphonium polyselenides), which ultimately decompose from the sample during the heat treatment, are very bulky and most of the film disappears during the annealing sequence (e.g., 70-87%). The resulting films consequently exhibit inferior connectivity and quality. The large percentage of the sample that is lost during the thermal treatment implies that only relatively thick films can be deposited using this technique, since thin films would be rendered discontinuous (the above mentioned study considered films with thickness ~25-35 µm). Additionally, relatively high temperatures are required for the thermal decomposition of the polyselenides (~530° C.), making this process incompatible with even the most thermally robust plastic substrates (e.g., Kapton sheet can withstand temperatures as high as 400° C.).

A study has also concluded that films of crystalline $MoS_2$ can be spin coated from a solution of $(NH_4)_2MoS_4$ in an organic diamine [J. Pütz and M. A. Aegerter, "Spin-Coating of $MoS_2$ Thin Films," Proc. of International Congress on Glass, vol. 18, San Francisco, Calif., Jul. 5-10 1998, 1675-1680]. However, high-temperature post-deposition anneals are required to achieve crystalline films (600-800° C.), rendering the process incompatible with organic based flexible substrate materials.

A similar procedure has led to the formation of amorphous $As_2S_3$ and $As_2Se_3$ films [G. C. Chem and I. Lauks, "Spin-Coated Amorphous Chalcogenide Films," *J Applied Phys.* 53, 6979-6982 (1982)], but attempts to deposit other main-group metal chalcogenides, such as $Sb_2S_3$ and $GeS_x$ have not been successful, due to the low solubility of the precursors in the diamine solvents [J. Pütz and M. A. Aegerter, "Spin-Coating of $MoS_2$ Thin Films," Proc. of International Congress on Glass, vol. 18, San Francisco, Calif., Jul. 5-10, 1998, 1675-1680].

More recently, improved solution-based processes have been invented for depositing films of a metal chalcogenide. In particular, see U.S. 2005/0009229A1 to Mitzi, entitled "Solution Deposition of Chalcogenide Films" and U.S. 2005/0009225A1 entitled "Hydrazine-Free Solution Deposition of Chalcogenide Films," entire disclosure of which are incorporated herein by reference. These new processes enable deposition of high-quality ultrathin spin-coated films with field-effect mobilities as high as 10 $cm^2$/V-sec, which is approximately an order of magnitude higher than prior examples of spin-coated semiconductors. These processes make it possible to simultaneously provide high carrier mobility and low-cost processing at moderate/low temperatures. Accordingly, many new applications could be envisioned for these technologies, including light, flexible, very large-area displays, cheap photovoltaics technologies, or other electronics constructed entirely on plastic.

SUMMARY

The present disclosure relates to a method of depositing a film of a metal chalcogenide comprising at least one transition metal chalcogenide. The method comprises dissolving a metal chalcogenide containing at least one transition metal in a hydrazine compound, and optionally an excess of chalcogen, to provide a solution of precursor of the metal chalcogenide; applying the solution of the precursor onto a substrate to produce a film of the precursor; and annealing the film of the precursor to produce the metal chalcogenide film comprising at least one transition metal chalcogenide on the substrate.

The present disclosure also relates to films produced by the above disclosed process.

The present disclosure provides methods of preparing a film of metal chalcogenide containing a transition metal chalcogenide semiconducting material that have the advantage of being low cost.

The low-cost metal chalcogenide semiconducting materials produced according to the present disclosure can be used in a variety of applications, including photovoltaic devices, flat panel displays, nonlinear optical/photo-conductive devices, chemical sensors, emitting and charge transporting layers in light-emitting diodes, thin-film transistors, channel layers in field-effect transistors, solar devices and media for optical data storage, including phase change media for optical data storage.

Accordingly, the present disclosure also relates to a method of preparing a field-effect transistor having a source region and a drain region, a channel layer including a semiconducting material, a gate region disposed in spaced adjacency to the channel region, an electrically insulating layer between the gate region and the source region, drain region and channel layer wherein the channel comprises a film of a metal chalcogenide semi-conducting material containing at least one transition metal chalcogenide; and wherein the method comprises depositing the film of the metal chalcogenide semi-conducting material by dissolving a metal chalcogenide containing at least one transition metal chalcogenide in hydrazine, and optionally an excess of chalcogen, to provide a solution of a precursor of the metal chalcogenide, applying the solution of said precursor onto a substrate to produce a film of said precursor; and annealing the film of the precursor to produce the metal chalcogenide film comprising at least one transition metal chalcogenide on the substrate.

The present disclosure also relates to field-effect transistors obtained by the above method.

Still other objects and advantages of the present disclosure will become readily apparent by those skilled in the art from the following detailed description, wherein it is shown and described only the preferred embodiments, simply by way of illustration of the best mode. As will be realized, the disclosure is capable of other and different embodiments, and its several details are capable of modifications in various obvious respects, without departing from the disclosure. Accordingly, the description is to be regarded as illustrative in nature and not as restrictive.

BRIEF DESCRIPTION OF DRAWINGS

FIG. 2a illustrates plots of drain current, $I_d$, versus source-drain voltage, $V_d$, as a function of gate voltage, $V_g$. FIG. 2b illustrates plots of $I_d$ and $I_d^{1/2}$ versus $V_g$ at constant $V_d$=−16V used to calculate current modulation $I_{on}/I_{off}$, and saturation regime mobility $\mu_{sat}$.

BEST AND VARIOUS MODES

Figure 1:
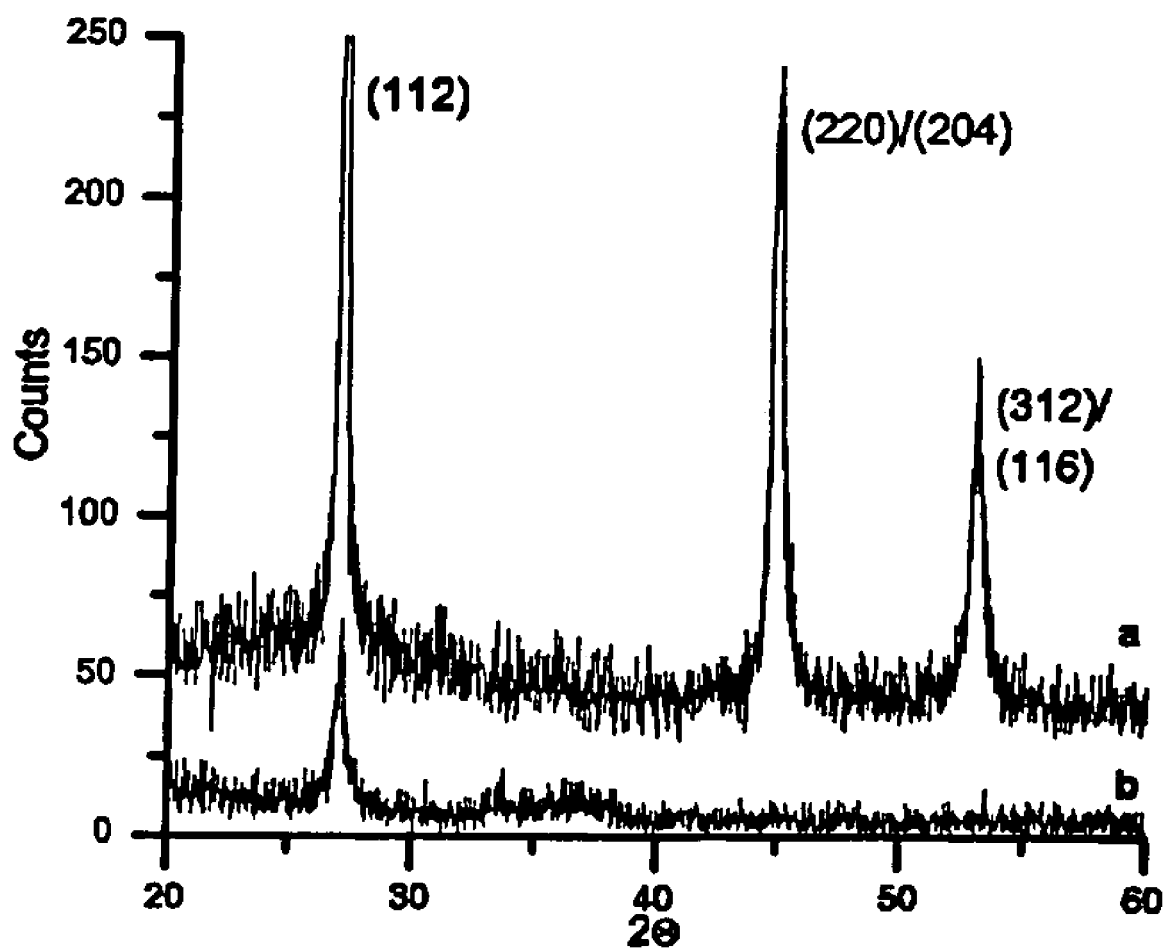
FIG. 1 shows x-ray diffraction patterns of a) $CuInS_xSe_{2-x}$ bulk powder and b) $CuInS_xSe_{2-x}$ thin film on a Si substrate prepared according to the present disclosure. Both patterns are collected using a CuKα x-ray source. The peaks are indexed according to JCPDS card number 36-1311 ($CuInS_xSe_{2-x}$).

The present disclosure relates to a method of depositing a film of a metal chalcogenide comprising at least one transition metal chalcogenide.

The method comprises dissolving a metal chalcogenide containing at least one transition metal chalcogenide in a hydrazine compound, and optionally an excess of chalcogen, to provide a solution of a precursor of the metal chalcogenide. It is understood, of course, that the mixtures of metal chalcogenides include mixtures of different transition metals as well as mixtures of transition metals with non-transition metals (e.g. main group metals), if desired.

The solution of the precursor is then applied to a substrate using for example spin coating, stamping or printing. More typically spin coating is employed.

The film of the precursor is then annealed to produce the metal chalcogenide film comprising at least one transition metal chalcogenide on the substrate. The precursor film can be decomposed into a film of the desired metal chalcogenide using heat achieved, for example, by placing the film on a hot plate, in an oven, or by using laser-based annealing.

More typically, heating of the precursor film is accomplished by placing a substrate containing the film on a hot plate with the temperature between about 50° C. and about 450° C. for a period of time between about 0.5 min to about 120 min.

Alternatively, the precursor may be isolated before applying to the substrate, using a process such as spin coating, and redissolved either in hydrazine-based or in an non-hydrazine-based solvent, as described in U.S. 2005/0009225A1, disclosure of which is incorporated herein by reference.

The present disclosure further comprises an improved thin-film field-effect transistor (TFT) with a semiconducting channel layer deposited using the above-described method.

The present disclosure further comprises multilayers deposited by repeating the above-described method steps.

The present disclosure further comprises an improved solar cell with an active chalcogenide layer deposited using the above-described method steps.

Transition metals refer to elements in which the filling of the outermost shell to eight electrons within a period is interrupted to bring the penultimate shell from 8 to 18 or 32 electrons. Only these elements can use penultimate shell orbitals as well as outermost shell orbitals in bonding. Transition elements include elements 21 through 29 (scandium through copper), 39 through 47 (yttrium through silver), 57 through 79 (lanthanum through gold), and all known elements from 89 (actinium) on.

Some more typical transition metals employed in this disclosure are copper, iron, cobalt, nickel, manganese, tungsten, molybdenum, zirconium, hafnium, titanium, and niobium.

More typically, the transition metal chalcogenide compound described in the first step of the above process comprises a transition metal and chalcogen (more typically $Cu_2S$).

One especially facile method (Method 1) of the present disclosure provides a simple method (Method 1) of depositing thin films of metal chalcogenides involving the use of a hydrazine or other hydrazine-like solvent (referred to herein as "a hydrazine compound")/chalcogen mixture as solvent for metal chalcogenides or mixtures of metal chalcogenides. The film deposition of the hydrazinium-based precursor is carried out by stamping, printing, or dip coating, using the above-mentioned solution. Thereafter, a short low-temperature anneal (typically, at a temperature less than about 350° C.) is carried out to remove excess hydrazine and hydrazinium chalcogenide salts from the sample and to improve the crystallinity of the resulting metal chalcogenide film.

Thus, the first method includes the steps of:

contacting at least one transition metal chalcogenide; a hydrazine compound represented by the formula:

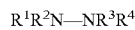

$R^1R^2N-NR^3R^4$ wherein each of $R^1$, $R^2$, $R^3$ and $R^4$ is independently hydrogen, aryl such as phenyl, a linear or branched alkyl having 1-6 carbon atoms such as methyl, ethyl or a cyclic alkyl of 3-6 carbon atoms; and optionally, an elemental chalcogen, such as S, Se, Te or a combination thereof; to produce a solution of a hydrazinium-based precursor of the metal chalcogenide;

applying the solution of the hydrazinium-based precursor of the metal chalcogenide onto a substrate to produce a film of the precursor; and thereafter annealing the film of the precursor to remove excess hydrazine and hydrazinium chalcogenide salts to produce a metal chalcodenide film on the substrate.

Typically, in this method each of $R^1$, $R^2$, $R^3$ and $R^4$ is independently hydrogen, aryl, methyl or ethyl. More typically, the hydrazine compound is hydrazine, i.e., where $R^1$, $R^2$, $R^3$ and $R^4$ are all hydrogens, methylhydrazine or 1,1-dimethylhydrazine.

The chalcogenide can further include an elemental chalcogen, such as S, Se, Te or a combination thereof. The metal chalcogenide includes a transition metal, such as Cu or a combination thereof and a chalcogen, such as, S, Se, Te or a combination thereof.

In one embodiment, the metal chalcogenide can be represented by the formula MX or $MX_2$ wherein M is a transition metal such as copper, iron, cobalt, nickel, manganese, tungsten, molybdenum, zirconium, hafnium, titanium, and niobium or a combination thereof and wherein X is a chalcogen, such as, S, Se, Te or a combination thereof.

In another embodiment, the metal chalcogenide can be represented by the formula $M_2X_3$ wherein M is a metal, such as lanthanum, yittrium, gadolinium and neodymium or a combination thereof and wherein X is a chalcogen, such as, S, Se Te or a combination thereof.

In yet another embodiment, the metal chalcogenide can be represented by the formula $M_2X$ wherein M is Cu and wherein X is a chalcogen, such, as S, Se, Te or a combination thereof.

Typically, the metal chalcogenide film is in the form of a thin film and the thin film has a thickness of from about 5 Å to about 2,000 Å, more preferably from about 5 Å to 1,000 Å.

The metal chalcogenide film can include a polycrystalline metal chalcogenide which has a grain size equal to or greater than the dimensions between contacts in a semiconductor device. However, the metal chalcogenide film can include single crystals of the metal chalcogenide.

The annealing step is carried out at a temperature and for a length of time sufficient to produce the metal chalcogenide film. Typically, the temperature is from about 25° C. to about 500° C. More typically, the temperature is from about 250° C. to about 350° C.

The procedure for forming the solution for processing is carried out by adding a hydrazine compound and chalcogen to the desired metal chalcogenide and stirring. Unlike the methods of the prior art, no laborious steps are required to form nanoparticles with a narrow size distribution. Additionally, the small molecular species (i.e., hydrazine/hydrazinium) that are acting to make the metal chalcogenide component soluble, constitutes only a small weight percent of the sample (generally <40%), such that only a relatively small volume fraction of the sample is lost during the thermal treatment. This fact enables the deposition of thinner and higher quality films when compared with the earlier work by Dhingra et al., in which polychalcogenides and larger organic cations are employed [see S. Dhingra et al., "The Use of Soluble Metal-Polyselenide Complexes as Precursors to Binary and Ternary Solid Metal Selenides," Mat. Res. Soc. Symp. Proc., 180, 825-830 (1990)].

Using the first technique described in the present disclosure (Method 1), a metal chalcogenide solution can be formed by adding a hydrazine compound and a chalcogen (generally, S, Se or Te) to the metal chalcogenide being deposited.

While metal chalcogenides are generally not significantly soluble in many cases, the combined action of hydrazine and the elemental chalcogen vastly improves the solubility of the metal chalcogenides. Further, the presence of an elemental chalcogen in small amounts may improve film properties, such as, surface wetting, phase purity, grain growth and film structure.

A possible mechanism that may be operative in the above system (using $MX_2$ as an example) is the following:

$$N_2H_4+2X \rightarrow N_2(gas)+2H_2X \quad 4N_2H_4+2H_2X+$$
$$2MX_2 \rightarrow 4N_2H_5^+ + M_2X_6^{4-} \text{(in solution)}$$

wherein M=a transition metal and X=S or Se.

In this case, the transition metal chalcogenide films can be deposited using spin coating, although they could equally be deposited using other solution-based techniques.

The present disclosure also provides a simple method (Method 2) of depositing thin films of transition metal chalcogenides involving (1) the synthesis of a soluble ammonium-based precursor; (2) the use of a hydrazine compound as a solvent for the precursor; (3) the deposition of a film using a standard solution-based technique (mentioned above) and (4) a low-temperature annealing step. The annealing step can be carried out at a temperature from about room temperature to about 500° C., but typically it is carried out at a temperature from about 250° C. to about 350° C.

The second method according to the present disclosure is similar to the first process, except that a chalcogenide and an amine are first contacted to produce an ammonium-based precursor of the metal chalcogenide, which is then contacted with a hydrazine compound and optionally, an elemental chalcogen. This method includes the steps of:

contacting at least one metal chalcogenide and a salt of an amine compound with $H_2S$, $H_2Se$ or $H_2Te$, wherein the amine compound is represented by the formula:

$$NR^5R^6R^7$$

wherein each of $R^5$, $R^6$, and $R^7$ is independently hydrogen, aryl such as phenyl, a linear or branched alkyl having 1-6 carbon atoms such as methyl, ethyl or a cyclic alkyl of 3-6 carbon atoms, to produce an ammonium-based precursor of the metal chalcogenide;

contacting the ammonium-based precursor of the metal chalcogenide, a hydrazine compound represented by the formula:

$$R^1R^2N-NR^3R^4$$

wherein each of $R^1$, $R^2$, $R^3$ and $R^4$ is independently hydrogen, aryl such as phenyl, a linear or branched alkyl having 1-6 carbon atoms such as methyl, ethyl or a cyclic alkyl of 3-6 carbon atoms, and optionally, an elemental chalcogen, such as S, Se, Te or a combination thereof, to produce a solution of a hydrazinium-based precursor of the transition metal chalcogenide in the hydrazine compound;

applying the solution of the hydrazinium-based precursor of the transition metal chalcogenide onto a substrate to produce a film of the precursor; and thereafter annealing the film of the precursor to remove excess hydrazine and hydrazinium chalcogenide salts to produce a metal chalcogenide film on the substrate.

Typically, each of $R^1$, $R^2$, $R^3$, $R^4$, $R^5$, $R^6$ and $R^7$ can independently be hydrogen, aryl such as phenyl, alkyl having 1-6 carbon atoms such as methyl and ethyl. More typically, $R^1$, $R^2$, $R^3$, $R^4$, $R^5$, $R^6$ and $R^7$ can independently be hydrogen, aryl, methyl and ethyl. More typically $R^1$, $R^2$, $R^3$, $R^4$, $R^5$, $R^6$ and $R^7$ are all hydrogens.

Typically, the amine compound is $NH_3$, $CH_3NH_2$, $CH_3CH_2NH_2$, $CH_3CH_2CH_2NH_2$, $(CH_3)_2CHNH_2$, $CH_3CH_2CH_2CH_2NH_2$, phenethylamine, 2-fluorophenethylamine, 2-chlorophenethylamine, 2-bromophenethylamine, 3-fluorophenethylamine, 3-chlorophenethylamine, 3-bromophenethylamine, 4-bromophenethylamine, 2,3,4,5,6-pentafluorophenethylamine or a combination thereof.

The ammonium metal chalcogenide precursor can be prepared by a variety of techniques depending on the metal chalcogenide under consideration. Examples of such techniques include simple dissolution of the metal chalcogenide in an ammonium chalcogenide aqueous solution followed by evaporation of the solvent, typically at room temperature, solvothermal techniques and by solid-state routes at elevated temperatures. In contrast to most metal chalcogenides, which are not substantially soluble in common solvents, the ammonium salts can be highly soluble in common solvents. The ammonium salts can be highly soluble in hydrazine with the vigorous evolution of ammonia and the formation of the hydrazinium salts of the metal chalcogenide [L. F. Audrieth et al., "The Chemisty of Hydrazine," John Wiley & Sons, New York, 200 (1951)].

Because the hydrazine moieties that solubilize the metal chalcogenide structure only weakly interact with the metal chalcogenide framework, they may be conveniently removed from the precursor film at low temperatures. Additionally, the starting materials are all chalcogenides (not halides or oxides), and therefore impurities of these elements, as well as carbon (when hydrazine is used as the solvent), are generally absent from the final films.

The present disclosure is distinct from the earlier disclosed use of hydrazine hydrate as a solvent for the precipitation of certain metal sulfides and selenides (e.g., zinc sulfide, copper selenide, silver-doped zinc sulfide, copper-doped zinc cadmium sulfide) [U.S. Pat. No. 6,379,585 to Vecht et al. entitled "Preparation of Sulfides and Selenides"]. In the case of this previous work, the solvent (which always involves water, as well as hydrazine) generally enables the precipitation of a transition metal chalcogenide, rather than the dissolution of the metal chalcogenide for further solution-based processing.

The present techniques are not limited to the use of hydrazine, but it can also be used with hydrazine-like solvents, as disclosed above, such as 1,1-dimethylhydrazine and methylhydrazine or mixtures of hydrazine-like solvents with other solvents including, but not limited to, water, methanol, ethanol, acetonitrile and N,N-dimethylformamide.

Following film deposition, low-temperature heat treatment of the film, typically at less than about 350° C., yields a crystalline film of the desired transition metal chalcogenide, with the loss of hydrazine and hydrazinium chalcogenide (and decomposition products of these compounds).

The films prepared according to Method 2 are of similar quality to those prepared directly from the metal chalcogenide, chalcogen and hydrazine (Method 1). In both cases (either using the ammonium metal chalcogenide precursor or the metal chalcogenide plus chalcogen), the high degree of solubility in hydrazine may be the result of the formation of the hydrazinium salt of the metal chalcogenide.

The films prepared by either method of the present disclosure can be removed from the substrate to produce an isolated film thereof.

Typically, the substrate is fabricated from a material having at least one property selected from the following: thermally stable, i.e., stable up to about at least 300° C.; chemically inert towards the metal chalcogenides; rigid or flexible. Suitable examples include Kapton, silicon, amorphous hydrogenated silicon, silicon carbide (SiC), silicon dioxide ($SiO_2$), quartz, sapphire, glass, metal, diamond-like carbon, hydrogenated diamond-like carbon, gallium nitride, gallium arsenide, germanium, silicon-germanium, indium tin oxide, boron carbide, boron nitride, silicon nitride ($Si_3N_4$), alumina ($Al_2O_3$), cerium (IV) oxide ($CeO_2$), tin oxide ($SnO_2$), zinc titanate ($ZnTiO_2$), a plastic material or a combination thereof. More typically, the metal substrate is a metal foil, such as, aluminum foil, tin foil, stainless steel foil and gold foil, and the plastic material more typically is polycarbonate, Mylar or Kevlar.

The processes described herein are useful in forming semiconductor films for applications including, for example, thin-film transistors (TFTs), light-emitting devices (LED's), data storage media, photovoltaic devices and solar devices.

Accordingly, the present disclosure includes an improved field-effect transistor, based on a solution-processed chalcogenide channel layer using either Method 1 or Method 2 of the present invention.

The present disclosure provides a thin film field-effect transistor (FET) having a film of a transition metal chalcogenide semiconducting material as the active semiconducting layer. The present disclosure provides a method of preparing an improved field-effect transistor of the type having a source region and a drain region, a channel layer extending between the source region and the drain region, the channel layer including a semiconducting material, a gate region disposed in spaced adjacency to the channel layer, an electrically insulating layer between the gate region and the source region, drain region and channel layer, wherein the method includes: preparing a channel layer including a film of a solution-processed transition metal chalcogenide semiconducting material using either Method 1 or Method 2 of the present disclosure.

In one embodiment, the source region, channel layer and drain region are typically disposed upon a surface of a substrate, the electrically insulating layer is disposed over the channel layer and extending from the source region to the drain region, and the gate region is disposed over the electrically insulating layer, for example, as shown in FIG. 4 of the U.S. Pat. No. 6,180,956, the disclosure of which are incorporated herein by reference.

In another embodiment, the gate region is disposed as a gate layer upon a surface of a substrate, the electrically insulating layer is disposed upon the gate layer, and the source region, channel layer, and drain region are disposed upon the electrically insulating layer, for example, as shown in FIG. 3 of the previously incorporated U.S. Pat. No. 6,180,956.

The metal chalcogenide semiconducting material may be in the form of a thin film, in which the metal chalcogenide semiconducting material is a polycrystalline material having a grain size equal to or greater than the dimensions between contacts in the semiconductor device. Accordingly, the present disclosure can provide an improved field-effect transistor prepared by the aforementioned method.

Photovoltaic cells might be constructed, incorporating the various methods of this disclosure, by layering the transition metal chalcogenide with other materials to form a two terminal, sandwich-structure device. For example, one could form a layer of $CuInS_xSe_{2-x}$ as disclosed herein on top of a metal contact, such as Mo which is supported on a rigid or flexible substrate (e.g. glass, metal, plastic). The $CuInS_xSe_{2-x}$ layer could then be covered with a buffer layer, which can be a metal chalcogenide such as CdS or ZnSe or an oxide such as $TiO_2$. This buffer layer could be deposited in the same fashion as the $CuInS_xSe_{2-x}$ layer using any of the methods of the present disclosure or it could be deposited more conventionally (e.g. by chemical bath or vapor deposition techniques). The buffer layer would then be covered with a transparent top contact such as doped $TiO_2$ completing the photovoltaic cell.

Alternatively, the cell could be constructed in the reverse order, using a transparent substrate (e.g. glass or plastic) supporting a transparent conducting contact (such as doped $TiO_2$, indium tin oxide, or fluorine-doped tin oxide). The buffer layer would then be deposited on this substrate and covered with the metal chalcogenide layer (such as $CuInS_xSe_{2-x}$ or CdTe), and finally with a back contact (such as Mo or Au). In either case, the buffer layer and/or the metal chalcogenide ("absorber") layer could be deposited by the methods described in this disclosure.

Further detailed methods involve isolating the precursor obtained by Method 1 or Method 2 disclosed above before applying to the substrate are referred to herein as Method 3. In particular, Method 3 comprises depositing thin films of transition metal chalcogenides using an isolated hydrazinium-based precursor of the transition metal chalcogenide to deposit the chalcogenide films. This method avoids the use of the hydrazine compound in the step of depositing the chalcogenide films.

The method of depositing the chalcogenide films in which an isolated hydrazinium-based precursor is used, i.e., Method 3, includes the steps of:

contacting an isolated hydrazinium-based precursor of a transition metal chalcogenide or mixtures of metal chalcogenides, comprising transition metal chalcogenides, and a solvent having therein a solubilizing additive to form a solution of a complex thereof;

applying the solution of the complex onto a substrate to produce a coating of the complex on the substrate; and thereafter annealing the film of the complex to decompose the complex and produce a metal chalcogenide film comprising at least one transition metal on the substrate.

The step of contacting an isolated hydrazinium-based precursor of a metal chalcogenide and a solvent that has therein a solubilizing additive produces a complex of the metal chalcogenide in which the hydrazine may be substantially replaced by the solubilizing additive to form the complex.

Suitable solvents include water, lower alcohols, such as methanol, ethanol, propanol, iso-propanol, n-butanol, iso-butyl alcohol, sec-butyl alcohol, cyclohexanol, ethers, such as diethyl ether, dibutyl ether, esters, such as, ethyl acetate, propyl acetate, butyl acetate, other solvents, such as, alkylene glycol of 2-6 carbon atoms, dialkylene glycol of 4-6 carbon atoms, trialkylene glycol of 6 carbon atoms, glyme, diglyme, triglyme, propylene glycol monoacetate, DMSO, DMF, DMA, HMPA and a mixture thereof.

The solubilizing additive can be an aliphatic amine of 1-10 carbon atoms, aromatic amine of 4-10 carbon atoms, aminoalcohol of 2-6 carbon atoms or a mixture thereof.

Typically, the aliphatic amine is selected from n-propylamine, iso-propylamine, n-butylamine, sec-butylamine, iso-butylamine, pentylamine, n-hexylamine, cyclohexylamine and phenethylamine, and the aromatic amine more typically is pyridine, aniline or aminotoluene. The aminoalcohol is more typically selected from ethanolamine, propanolamine, diethanolamine, dipropanolamine, triethanolamine and tripropanolamine. Other suitable amines can also be used provided they promote solubility of the hydrazinium-based precursor of a metal chalcogenide in the solvent selected.

The film deposition of the hydrazinium-based precursor is carried out by standard solution-based techniques using a solution of an isolated hydrazinium-based precursor in a solvent. Suitable solution-based techniques include spin coating, stamping, printing, or dip coating, using the above-mentioned solution. After removing the solvent, a short low-temperature anneal (typically, at a temperature less than about 350° C.) is carried out to decompose the hydrazinium chalcogenide salts from the sample and to improve the crystallinity of the resulting metal chalcogenide.

Method 3 of the present disclosure includes four stages:
1. isolating (synthesizing) the hydrazinium precursor of the metal chalcogenide compound;
2. forming a solution of the hydrazinium precursor in a suitably chosen non-hydrazine-based solvent mixture;
3. solution processing a thin film of the chalcogenide precursor from the solution mixture described in stage 2 using a technique such as spin coating, stamping or printing; and
4. decomposing the resulting precursor film into a film of the desired metal chalcogenide using heat achieved, for example, by placing the film on a hot plate, in an oven, or by using laser-based annealing.

Typically, solution processing in stage 3 is accomplished by spin coating.

The heating of the film in stage 4 is typically accomplished by placing a substrate containing the film on a hot plate with the temperature set between 50° C. and 450° C. for a period of time between 0.5 min to 120 min.

The metal chalcogenide compound described in stage I includes a transition group metal and a chalcogen.

The non-hydrazine-based solvent of stage 2 typically includes an organic amine (e.g., propylamine, butylamine, phenethylamine, ethylenediamine) and/or an alcohol amine such as ethanolamine.

The non-hydrazine-based solvent mixture of stage 2 may include excess chalcogen (S, Se, Te) mixed with the organic amine to control the resulting metal chalcogenide-stoichiometry and improve the film formation.

Typically, the metal chalcogenide film is in the form of a thin film and the thin film has thickness of from about 5 Å to about 2,000 Å, more preferably from about 5 Å to about 1,000 Å.

The following non-limiting example is presented to further illustrate the present disclosure.

EXAMPLE

CuInSSe

1) The precursor solution is formed by mixing two separately prepared solutions, one containing $Cu_2S$ and S and one containing $In_2Se_3$ and Se, in equal proportions. The two solutions are prepared as follows: For the first, 159 mg (1 mmol) $Cu_2S$ and 64 mg (2 mmol) S are dissolved in 4 mL distilled hydrazine to form a yellow solution. For the second, 467 mg (1 mmol) $In_2Se_3$ and 79 mg (1 mmol) Se are dissolved in 4 mL distilled hydrazine to form a clear, viscous solution. The two solutions are mixed in equal proportion and then diluted 1 to 15 times with distilled hydrazine to form the final precursor solution.

This solution could also be prepared directly by dissolving all the materials at once in distilled hydrazine. Furthermore, the molar ratios of S to $Cu_2S$ and of Se to $In_2Se_3$ have each been varied to modify the properties of the precursor thin films (see 2 below). In addition, the Se may be replaced entirely with S. Finally, the ratio of Cu-containing to In-containing solution in the mixture can be varied to control the Cu to In ratio in the final metal chalcogenide in order to control the electrical properties of the thin semiconducting films prepared as below. When the hydrazine is dried from the described precursor solution, a dark brown, glassy solid is formed, which appears amorphous by x-ray diffraction. It can be converted to the metal chalcogenide by heating the powder to about 400° C. under flowing nitrogen (see FIG. 1a).

2) Thin films of the precursor are formed by spin casting. The 2 cm square Si substrates are heavily n-doped and coated with approximately 40 nm of thermally grown $SiO_2$. They are cleaned using a soap scrub, sonication in ethanol and methylene chloride, and a piranha soak (approximately 4:1 concentrated sulfuric acid to hydrogen peroxide by volume). The precursor solution is dropped onto a substrate through a 0.2 μm pore size PTFE filter to nearly cover the surface. The spinning program and dilution factor are varied to achieve uniform thickness films over a range of thickness from 3 to 100 nm thick. To form thin films for TFTs, a typical dilution is 8 times with an initial, 1 second spin at 100 rpm followed by a ramp to 3500 rpm where the speed is maintained for about 50 seconds. The spin casting process is carried out in an inert atmosphere glove box to avoid oxidation of the precursor.

3) The decomposition of the precursor to give the metal chalcogenide thin film is accomplished by placing the substrate on a hotplate, also in the inert environment glove box. The conversion temperature is varied from about 320° C. to 370° C. and can be preceded either by 3-5 min at about 100° C. to dry the film, or by a slow ramp of the temperature, or both. In any case, the final temperature is maintained for 20 minutes. X-ray diffraction of the resulting films confirmed they are, in fact, the expected metal chalcogenide (see FIG. 1b). In some cases, the resulting metal chalcogenide films are post processed by annealing at about 200° C. in air for about 5 to 30 minutes, which is found to increase their conductivity.

Figure 2A:
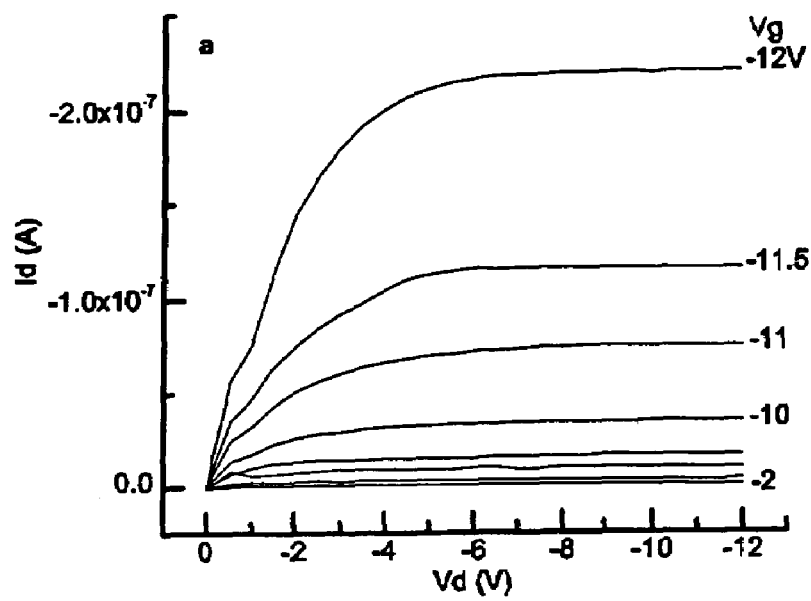
FIGS. 2a and 2b illustrate electrical characteristics of a $CuInS_xSe_{2-x}$ TFT with a spin cast channel approximately 500 µm wide and 21 µm long.
Figure 2B:
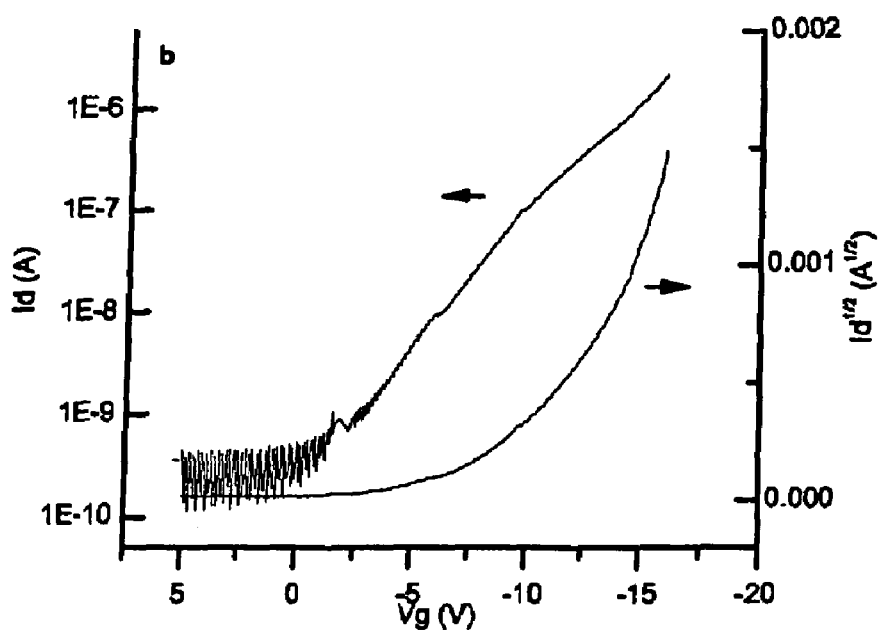

Thin film transistors are demonstrated by depositing gold source and drain electrodes on top of the semiconducting thin films thus formed. A representative plot of drain current, $I_d$, versus source-drain voltage, $V_d$, is shown in FIG. 2a as a function of the applied gate voltage, $V_g$, for a $CuIn\,S_xSe_{2-x}$ (x≈0.1) TFT prepared as described above. It operates as a p-channel transistor in accumulation mode upon application of a negative gate bias. Under positive gate bias, the channel is depleted of holes and the device shuts off. At low $V_d$, the current rises approximately linearly with applied bias, saturating at high $V_d$. Current modulation ($I_{on}/I_{off}$) and saturation regime field-effect mobility ($\mu_{sat}$) are calculated from the plot of $I_d$ and $I_d^{1/2}$ versus $V_g$ (FIG. 2b), yielding $I^{on}/I_{off}$=2× $10^4$ and ($\mu_{sat}$)=0.25 cm²/V·s, respectively, for a −16 to 5 V gate sweep and $V_d$=−16V. The mobility, however is highly field dependent so that the linear regime mobility derived from the plots in FIG. 2a is approximately one order of magnitude less than the saturation regime mobility.

The foregoing description illustrates and describes the disclosure. Additionally, the disclosure shows and describes only the preferred embodiments but, as mentioned above, it is to be understood that it is capable to use in various other combinations, modifications, and environments and is capable of changes or modifications within the scope of the invention concepts as expressed herein, commensurate with the above teachings and/or the skill or knowledge of the relevant art. The embodiments described herein above are further intended to explain best modes known by applicant and to enable others skilled in the art to utilize the disclosure in such, or other, embodiments and with the various modifications required by the particular applications or uses thereof. Accordingly, the description is not intended to limit the invention to the form disclosed herein. Also, it is intended to the appended claims be construed to include alternative embodiments.

All publications and patent applications cited in this specification are herein incorporated by reference, and for any and all purposes, as if each individual publication or patent application were specifically and individually indicated to be incorporated by reference.

What is claimed is:

1. A method of depositing a film of a metal chalcogenide comprising at least one transition metal chalcogenide which comprises
    dissolving a metal chalcogenide containing at least one transition metal chalcogenide in a hydrazine compound and optionally, an excess of chalcogen to provide a precursor of the metal chalcogenide;
    applying a solution of said precursor onto a substrate to produce a film of said precursor; and
    annealing the film of the precursor to produce the metal chalcogenide film comprising at least one transition metal chalcogenide on the substrate.

2. The method of claim 1 wherein the solution is applied by spin coating, stamping or printing.

3. The method of claim 1 wherein the solution is applied by spin coating.

4. The method of claim 1 wherein the annealing is carried out by placing the film on a hot plate, in an oven or by laser-based annealing.

5. The method of claim 1 wherein the annealing is carried out by placing a substrate containing the film on a hot plate with the temperature between about 50° C. and 450° C. for a period of time between 0.5 min to 120 min.

6. The method of claim 1 wherein the transition metal chalcogenide comprises $Cu_2S$.

7. The method of claim 1 which further comprises isolating the precursor prior to the applying and then redissolving the precursor in a non-hydrazine based solvent.

8. A method for fabricating a photovoltaic cell which comprises providing a metallic contact on a supporting substrate;
    depositing a film of a metal chalcogenide comprising at least one transition metal chalcogenide by the method of claim 1 on said metallic contact;
    covering said film with a buffer layer; and
    providing a transparent top conducting contact on said buffer layer.

9. A method for fabricating a photovoltaic cell which comprises providing a transparent conducting contact on a supporting substrate;
    depositing a buffer layer on said transparent conducting contact;
    depositing a film of a metal chalcogenide comprising at least one transition metal chalcogenide by the method of claim 1 on said buffer layer; and
    providing a back conducting contact on said film of a metal chalcogenide.

10. The method of claim 1 which comprises contacting: at least one transition metal chalcogenide; a hydrazine compound represented by the formula:

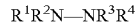

wherein each of $R^1$, $R^2$, $R^3$ and $R^4$ is independently selected from the group consisting of: hydrogen, aryl, a linear or branched alkyl having 1-6 carbon atoms such as methyl, ethyl or a cyclic alkyl of 3-6 carbon atoms; and optionally, an elemental chalcogen selected from the group consisting of: S, Se, Te and a combination thereof to produce a solution of a hydrazinium-based precursor of said transition metal chalcogenide;
    applying said solution of said hydrazinium-based precursor of said transition metal chalcogenide onto a substrate to produce a film of said precursor; and thereafter
    annealing said film of said precursor to remove excess hydrazine and hydrazinium chalcogenide salts to produce a transition metal chalcogenide film on said substrate.

11. The method of claim 10, wherein said metal chalcogenide is represented by the formula $M_2X$ wherein M is Cu and wherein X is a chalcogen selected from the group consisting of S, Se, Te and a combination thereof.

12. The method of claim 10, wherein each of $R^1$, $R^2$, $R^3$ and $R^4$ is independently selected from the group consisting of: hydrogen, aryl, methyl and ethyl.

13. The method of claim 10, wherein $R^1$, $R^2$, $R^3$ and $R^4$ are hydrogen.

14. The method of claim 10 wherein the solution is applied by spin coating, stamping or printing.

15. The method of claim 10 wherein the annealing is carried out by placing a substrate containing the film on a hot plate with the temperature between about 50° C. and 450° C. for a period of time between 0.5 min to 120 min.

16. The method of claim 10 wherein the transition metal chalcogenide comprises $Cu_2S$.

17. The method of claim 1, wherein said substrate is selected from the group consisting of:
    kapton, silicon, amorphous hydrogenated silicon, silicon carbide (SiC), silicon dioxide ($SiO_2$), quartz, sapphire, glass, metal, diamond-like carbon, hydrogenated diamond-like carbon, gallium nitride, gallium arsenide, germanium, silicon-germanium, indium tin oxide, boron carbide, boron nitride, silicon nitride ($Si_3N_4$), alumina ($Al_2O_3$), cerium (IV) oxide ($CeO_2$), tin oxide ($SnO_2$), zinc titanate ($ZnTiO_2$), a plastic material and a combination thereof.

18. The method of claim 10 which further comprises isolating the precursor prior to the applying and then redissolving the precursor in a non-hydrazine based solvent.

19. The method of claim 1 which comprises contacting: at least one transition metal chalcogenide and a salt of an amine compound with $H_2S$, $H_2Se$ or $H_2Te$, wherein said amine compound is represented by the formula:

wherein each of $R^5$, $R^6$ and $R^7$ is independently selected from the group consisting of: hydrogen, aryl, a linear or branched alkyl having 1-6 carbon atoms such as methyl, ethyl or a cyclic alkyl of 3-6 carbon atoms, to produce an ammonium-based precursor of said transition metal chalcogenide;

contacting said ammonium-based precursor of said transition metal chalcogenide, a hydrazine compound represented by the formula:

$$R^1R^2N-NR^3R^4$$

wherein each of $R^1$, $R^2$, $R^3$ and $R^4$ is independently selected from the group consisting of: hydrogen, aryl, a linear or branched alkyl having 1-6 carbon atoms such as methyl, ethyl or a cyclic alkyl of 3-6 carbon atoms, and optionally, an elemental chalcogen selected from the group consisting of: S, Se Te and a combination thereof to produce a solution of a hydrazinium-based precursor of metal chalcogenide in said hydrazine compound;

applying said solution of said hydrazinium-based precursor of said transition metal chalcogenide onto a substrate to produce a film of said precursor; and thereafter annealing said film of said precursor to remove excess hydrazine and hydrazinium chalcogenide salts to produce a transition metal chalcogenide film on said substrate.

20. The method of claim 19 which further comprises isolating the hydrazinium precursor prior to the applying and then redissolving the hydrazinium precursor in a non-hydrazine based solvent.

21. The method of claim 19, wherein said metal chalcogenide is represented by the formula $M_2X$ wherein M is Cu and wherein X is a chalcogen selected from the group consisting of S, Se, Te and a combination thereof.

22. The method of claim 19, wherein each of $R^1$, $R^2$, $R^3$ and $R^4$ is independently selected from the group consisting of: hydrogen, aryl, methyl and ethyl.

23. The method of claim 19, wherein $R^1$, $R^2$, $R^3$ and $R^4$ are hydrogen.

24. The method of claim 19 wherein the solution is applied by spin coating, stamping or printing.

25. The method of claim 19 wherein the annealing is carried out by placing a substrate containing the film on a hot plate with the temperature between about 50° C. and 450° C. for a period of time between 0.5 min to 120 min.

26. The method of claim 19 wherein the transition metal chalcogenide comprises $Cu_2S$.

27. A method of preparing an improved field-effect transistor of the type having a source region and a drain region, a channel layer extending between the source region and the drain region, the channel layer including a semiconducting material, a gate region, disposed in spaced adjacency to the channel layer, an electrically insulating layer between the gate region and the source region, drain region and channel layer, wherein the method comprises:

preparing a channel layer comprising a film of a transition metal chalcogenide semiconducting material by dissolving a metal chalcogenide containing at least one transition metal chalcogenide in hydrazine and an excess of chalcogen to provide a precursor of the metal chalcogenide;

applying a solution of said precursor onto a substrate to produce a film of said precursor; and annealing the film of the precursor to produce the metal chalcogenide film comprising at least one transition metal chalcogenide on said substrate.

* * * * *